United States Patent
Cho

(10) Patent No.: US 7,034,598 B2
(45) Date of Patent: Apr. 25, 2006

(54) SWITCHING POINT DETECTION CIRCUIT AND SEMICONDUCTOR DEVICE USING THE SAME

(75) Inventor: Kwang-Rae Cho, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 95 days.

(21) Appl. No.: 10/335,013

(22) Filed: Dec. 31, 2002

(65) Prior Publication Data

US 2004/0000944 A1   Jan. 1, 2004

(30) Foreign Application Priority Data

Jun. 29, 2002   (KR) .................. 10-2002-0037278

(51) Int. Cl.
*H03H 11/26*   (2006.01)
(52) U.S. Cl. .................. 327/277; 327/80; 327/81; 327/278
(58) Field of Classification Search ................ 327/58, 327/72, 77, 78, 80, 81, 277, 278
See application file for complete search history.

(56) References Cited

U.S. PATENT DOCUMENTS

| | | | | |
|---|---|---|---|---|
| 4,670,706 A | * | 6/1987 | Tobita | ........................ 327/576 |
| 4,786,824 A | * | 11/1988 | Masuda | ........................ 327/76 |
| 4,922,141 A | * | 5/1990 | Lofgren et al. | ............. 327/158 |
| 4,943,945 A | * | 7/1990 | Lai | ........................ 365/189.09 |
| 5,170,076 A | * | 12/1992 | Smith | .......................... 327/74 |
| 5,231,319 A | * | 7/1993 | Crafts et al. | ................. 327/277 |
| 5,298,814 A | * | 3/1994 | Caruso | ....................... 327/105 |
| 5,488,322 A | | 1/1996 | Kaplinsky | |
| 5,572,147 A | * | 11/1996 | Huang et al. | .................. 326/33 |
| 5,757,225 A | * | 5/1998 | Tobita | ......................... 327/539 |
| 5,886,561 A | * | 3/1999 | Eitan et al. | ................. 327/408 |
| 5,920,210 A | | 7/1999 | Kaplinsky | .................... 327/112 |
| 6,028,458 A | * | 2/2000 | Hamaguchi | ................... 327/89 |
| 6,087,885 A | * | 7/2000 | Tobita | ......................... 327/379 |
| 6,388,483 B1 | * | 5/2002 | Mizuno et al. | ............. 327/158 |
| 6,774,695 B1 | * | 8/2004 | Hayashi et al. | ............. 327/333 |
| 2004/0160258 A1 | * | 8/2004 | Tobita | ......................... 327/333 |

OTHER PUBLICATIONS

Notice of Preliminary Rejection for Korean patent application 2002-37278 dated Mar. 31, 2004, issued by the Korean Intellectual Property Office.

* cited by examiner

*Primary Examiner*—Terry D. Cunningham
(74) *Attorney, Agent, or Firm*—Marshall, Gerstein & Borun LLP

(57) ABSTRACT

A switching point detection circuit for detecting a switching point according to a fabrication condition of a MOS transistor includes a reference voltage generation circuit for generating a reference voltage, a first CMOS inverter circuit for receiving the reference voltage, and a second CMOS inverter circuit for receiving the reference voltage, wherein an NMOS transistor is a dominant transistor for the reference voltage in the first CMOS inverter circuit and a PMOS transistor is a dominant transistor for the reference voltage in the second CMOS inverter circuit.

21 Claims, 19 Drawing Sheets

FIG. 3

| P_mos | N_mos | det_1.6b | det_2.4b |
|---|---|---|---|
| N | N | L | H |
| N | F | L | H |
| N | S | L | H |
| F | N | L | H |
| F | F | L | H |
| F | S | H | H |
| S | N | L | H |
| S | F | L | L |
| S | S | L | H |

11 (F, S row)
12 (S, F row)

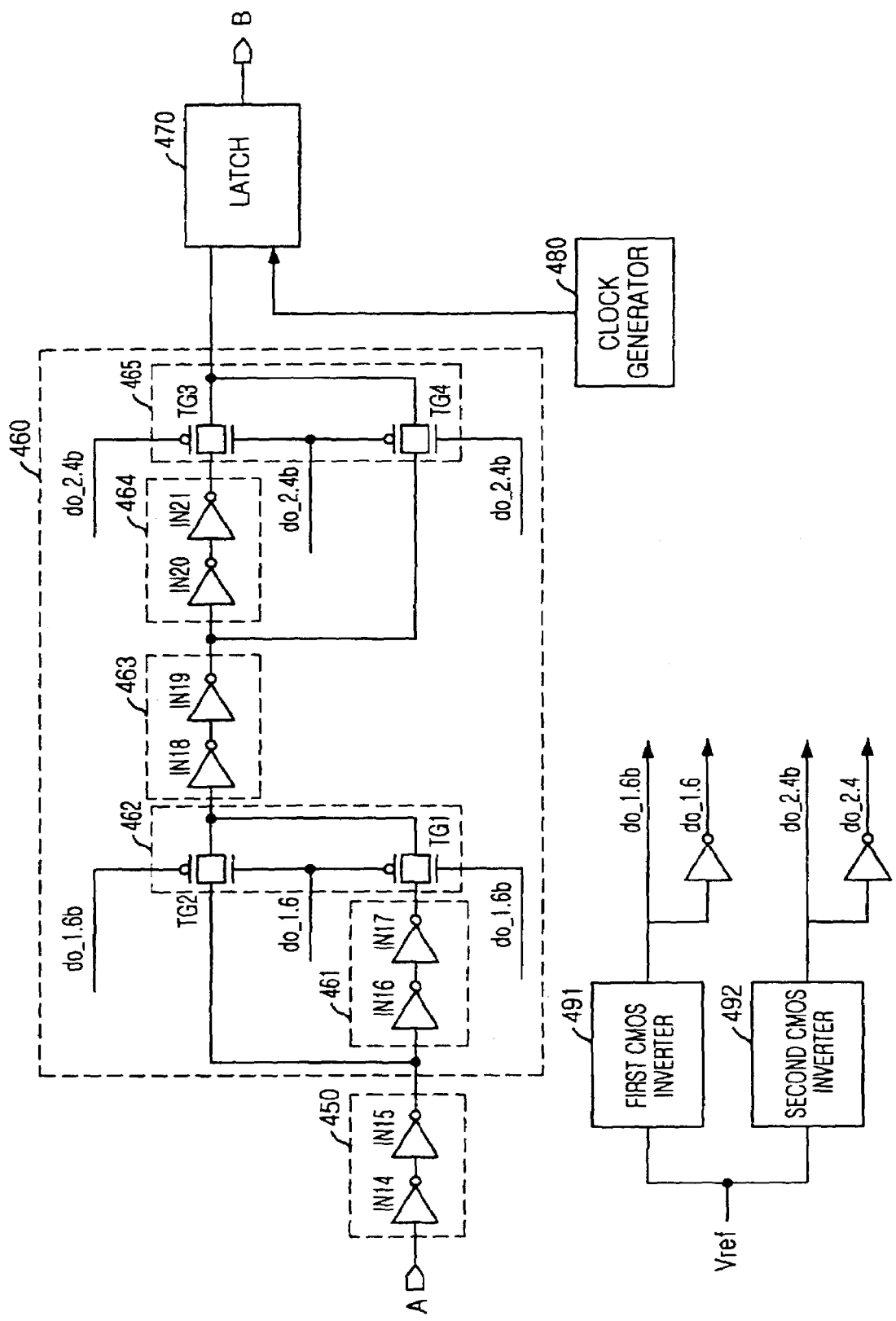

SWITCHING POINT DETECTION CIRCUIT AND SEMICONDUCTOR DEVICE USING THE SAME

BACKGROUND

1. Technical Field

A switching point detection circuit for detecting a switching point according to a fabrication condition of a MOS transistor of a semiconductor device is disclosed.

2. Description of The Related Art

When an input voltage signal for a CMOS inverter is transited from a logic high level, e.g. 3.3 V, to a logic low level, e.g. 0 V, or from a logic low level, e.g. 0 V, to a logic high level, e.g. 3.3 V, in a semiconductor device, it is important that output voltage signals from the CMOS inverter have a symmetric voltage characteristic. Therefore, the CMOS inverter is generally designed such that the output voltage signal is switched from a logic high level to a logic low level or from a logic low level to a logic high level when the voltage level of the input voltage signal becomes a half level of the driving voltage of the CMOS inverter.

However, an MOS transistor may be fabricated in a different manner from that of a designed MOS transistor due to various conditions in the semiconductor fabrication process. When the MOS transistor is optimally fabricated to have the same condition with the designed MOS transistor, the MOS transistor is marked with 'N', which means a normal operation. If the MOS transistor is fabricated to have a faster operation than the designed MOS transistor, the MOS transistor is marked with 'F', which means a fast operation. Also, if the MOS transistor is fabricated to have a slower operation than the designed MOS transistor, the MOS transistor is marked with 'S', which means a slow operation. The slower operation or the faster operation means whether a current flowing between source and drain in the MOS transistor is high or low, respectively, when a constant voltage is applied to a gate thereof.

The characteristic of a MOS transistor having a faster operation or a slower operation is determined by conditions of a semiconductor fabrication process, such as a doping density in a source/drain region, channel width and length, and the like, which may be differently fabricated from the designed MOS transistor.

Hereinafter, a fabrication condition of a PMOS transistor and an NMOS transistor is marked with 'N', 'F' and 'S'. For example, when a PMOS transistor is fabricated to have the same condition as the designed PMOS transistor, and an NMOS transistor is fabricated to have a faster operation than that of the designed NMOS transistor, the MOS transistors are marked with 'PNNF'.

FIG. 1A is a circuit diagram illustrating a typical CMOS inverter.

As shown, a typical CMOS inverter consists of a PMOS transistor P1 for outputting a power supply voltage VDD as an output voltage signal Vout when an input signal Vin is a low level voltage signal and an NMOS transistor for outputting a ground voltage VSS as an output voltage signal Vout when the input signal Vin is a high level voltage signal.

An operation characteristic of the CMOS inverter may be varied according to fabrication conditions, such as power supply voltage, temperature and the like. Since the MOS transistors P1 and N1 in the inverter may be differently fabricated from the designed MOS transistors due to the fabrication conditions, an operation characteristic of the inverter may be severely varied.

FIG. 1B is a waveform illustrating switching points of the inverter of FIG. 1 according to the fabrication conditions of the MOS transistor.

As shown, the CMOS inverter should be designed to switch the outputs at a half supply voltage VDD/2, as is the case of the 'a' waveform. However, when the NMOS transistor N1 is fabricated with 'N' and the PMOS transistor P1 is fabricated with 'F' according to fabrication conditions, the CMOS inverter has a switching operation characteristic of the waveform 'b' in FIG. 1B. Also, when the NMOS transistor N1 is fabricated with 'F' and the PMOS transistor P1 is fabricated with 'N', the CMOS inverter has a switching operation characteristic of the waveform 'c' in FIG. 1B.

If the operation characteristic of the PMOS and NMOS transistors is varied according to the MOS transistor fabrication conditions, an operation characteristic of the CMOS inverter is varied. Therefore, if this CMOS inverter is applied to an integrated circuit IC, operation reliability of the IC cannot be secured.

Accordingly, in order to secure a stable operation characteristic of the inverter regardless of the MOS transistor fabrication conditions, a circuit capable of adjusting the switching point of the inverter by detecting the MOS transistor fabrication conditions is needed.

SUMMARY OF THE DISCLOSURE

A detection circuit for detecting a switching point of an inverter in a semiconductor device is disclosed.

In accordance with one embodiment, a switching point detection circuit for detecting a switching point according to the fabrication condition of a MOS transistor includes: a reference voltage generation circuit for generating a reference voltage; a first CMOS inverter circuit for receiving the reference voltage; and a second CMOS inverter circuit for receiving the reference voltage, wherein an NMOS transistor is a dominant transistor for the reference voltage in the first CMOS inverter circuit and a PMOS transistor is a dominant transistor for the reference voltage in the second CMOS inverter circuit.

In accordance with another embodiment, a switching point detection circuit for detecting a switching point according to a fabrication condition of a MOS transistor includes: a reference voltage generation circuit for generating a first reference voltage and a second reference voltage, the first reference voltage being higher than a half power supply voltage, and the second reference voltage being lower than the half power supply voltage; a first CMOS inverter circuit for receiving the first reference voltage; and a second CMOS inverter circuit for receiving the second reference voltage, wherein each of the first CMOS inverter circuit and the second CMOS inverter circuit has a switching point at the half power supply voltage.

In accordance with yet another embodiment, a semiconductor device includes: a buffering circuit for buffering an input signal; a switching point detection circuit for detecting a switching point variation of a CMOS inverter according to a fabrication condition of a MOS transistor; and a delay circuit for delaying the input signal under control of the switching point detection circuit.

In accordance with yet another embodiment, a semiconductor device includes: a switching point detection circuit for detecting a switching point variation of a CMOS inverter according to a fabrication condition of a MOS transistor. The switching point detection circuit includes: a reference voltage generation circuit for generating a reference voltage; a first CMOS inverter circuit for receiving the reference voltage, an NMOS transistor in the first CMOS inverter circuit being a dominant transistor for the reference voltage; and a second CMOS inverter circuit for receiving the reference voltage, a PMOS transistor in the second CMOS inverter circuit being a dominant transistor for the reference voltage; a first multiplexer for selectively outputting a power supply voltage or an input signal according to an output signal of the first CMOS inverter circuit; a second multiplexer for selectively outputting the power supply voltage or the input signal according to an output signal of the second CMOS inverter circuit; a third CMOS inverter circuit for inverting the input signal; a first pull-up circuit for performing a pull-up operation for an output of the third CMOS inverter circuit according to an output signal of the first multiplexer; and a second pull-up circuit for performing a pull-up operation for an output of the third CMOS inverter circuit according to an output signal of the second multiplexer.

In accordance with yet another embodiment, a A disclosed semiconductor memory device includes: a switching point detection circuit for detecting a switching point variation of a CMOS inverter according to a fabrication condition of a MOS transistor. The switching point detection circuit includes: a reference voltage generation circuit for generating a first reference voltage and a second reference voltage, the first reference voltage being higher than a half power supply voltage, and the second reference voltage being lower than the half power supply voltage; a first CMOS inverter circuit for receiving the first reference voltage, the first CMOS inverter circuit having a switching point at the half power supply voltage; and a second CMOS inverter circuit for receiving the second reference voltage, the second CMOS inverter circuit having a switching point at the half power supply voltage; a first multiplexer for selectively outputting a power supply voltage or an input signal according to an output signal of the first CMOS inverter circuit; a second multiplexer for selectively outputting the power supply voltage or the input signal according to an output signal of the second CMOS inverter circuit; a third CMOS inverter circuit for inverting the input signal; a first pull-up circuit for performing a pull-up operation for an output of the third CMOS inverter circuit according to an output signal of the first multiplexer; and a second pull-up circuit for performing a pull-up operation for the output of the third CMOS inverter circuit according to an output signal of the second multiplexer.

BRIEF DESCRIPTION OF THE DRAWINGS

The above and other features of the disclosed circuits and devices will become apparent from the following description of embodiments taken in conjunction with the accompanying drawings, wherein:

FIG. 3 is a diagram showing a logic table representing operation conditions of the switching point detection circuit of FIG. 2A;

FIG. 9B is a circuit diagram illustrating an input buffer having a switching point detection circuit in accordance with the present disclosure;

DETAILED DESCRIPTION

Hereinafter, a semiconductor device having a detection circuit for detecting a switching point of an inverter according to MOS transistor fabrication conditions in order to secure a stable operation characteristic of the semiconductor will be described in detail referring to the accompanying drawings.

Figure 1A:
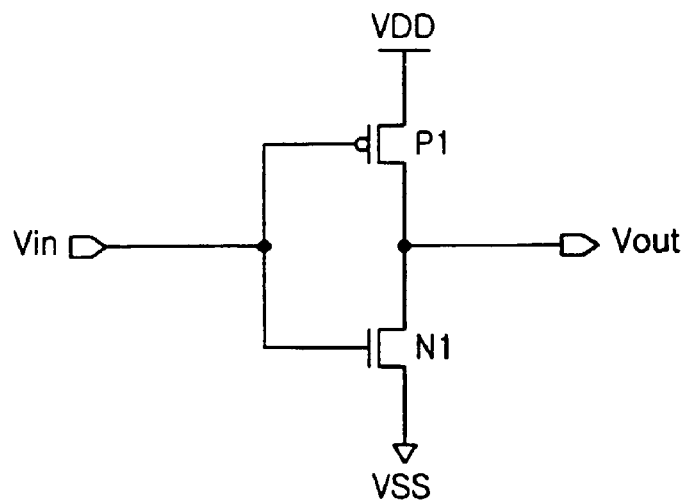
FIG. 1A is a circuit diagram illustrating a typical CMOS inverter.
Figure 1B:
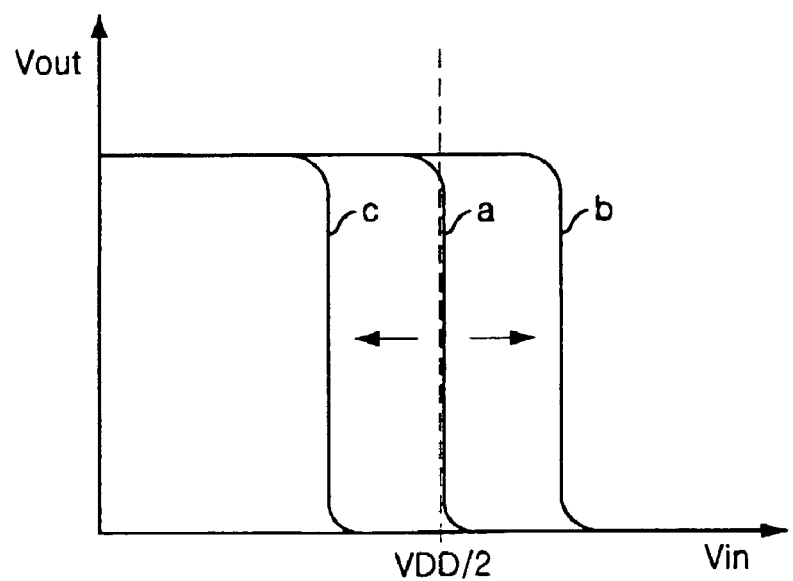
FIG. 1B is a waveform illustrating switching points of the inverter of FIG. 1.
Figure 2A:
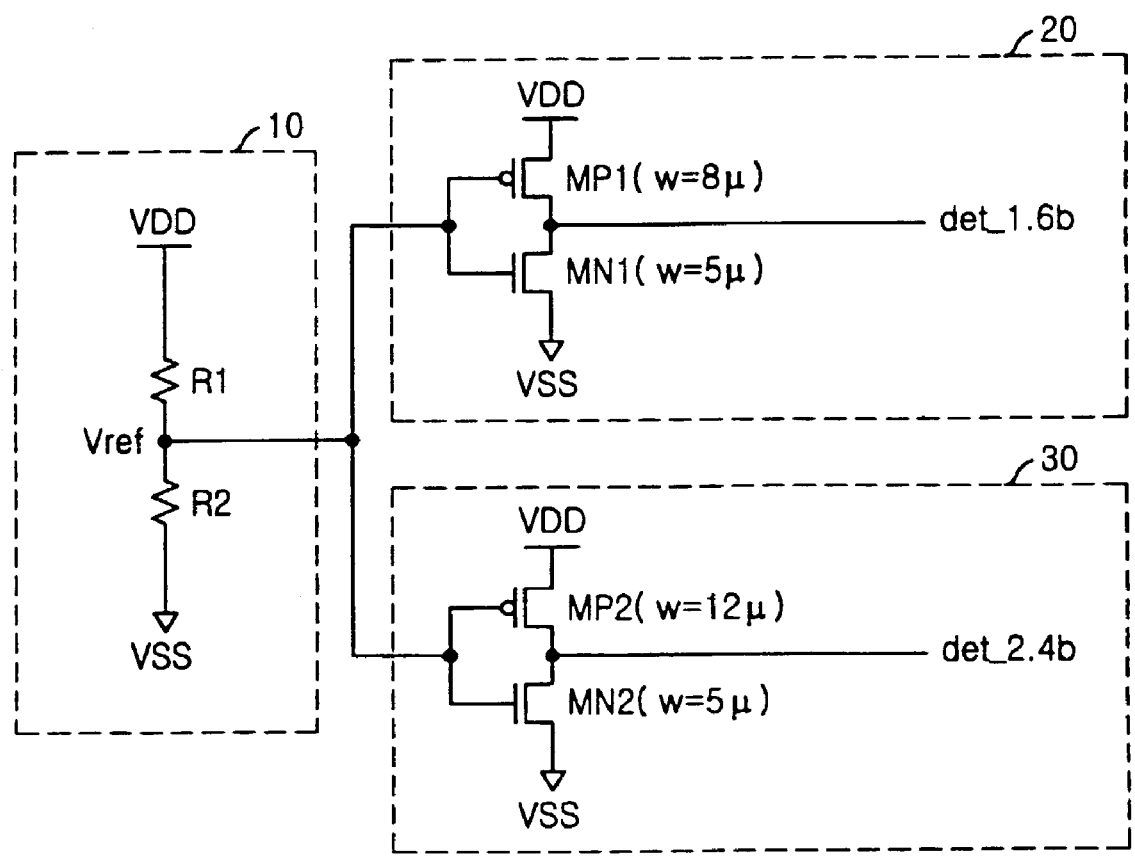
FIG. 2A is a circuit diagram illustrating a switching point detection circuit in accordance with one embodiment.

FIG. 2A is a circuit diagram illustrating a switching point detection circuit for detecting the switching point according to the MOS transistor fabrication conditions.

As shown, the switching point detection circuit includes a reference voltage generator 10, a first inverter 20 and a second inverter 30. The reference voltage generator 10 includes a first resistance R1 and a second resistance R2 coupled in series between a power supply voltage VDD and a ground voltage VSS. A voltage divided by the first and second resistances R1 and R2 is used as a reference voltage Vref generated from a junction node of the first and second resistances R1 and R2. Since the resistance is not sensitive to fabrication conditions, a variation of the reference voltage Vref is not large.

The first inverter 20 is fabricated by which an NMOS transistor MN1 is dominant and the second inverter 30 is fabricated by which a PMOS transistor MP2 is dominant by adjusting channel width-to-length ratio of the NMOS or PMOS transistor.

Figure 2B:
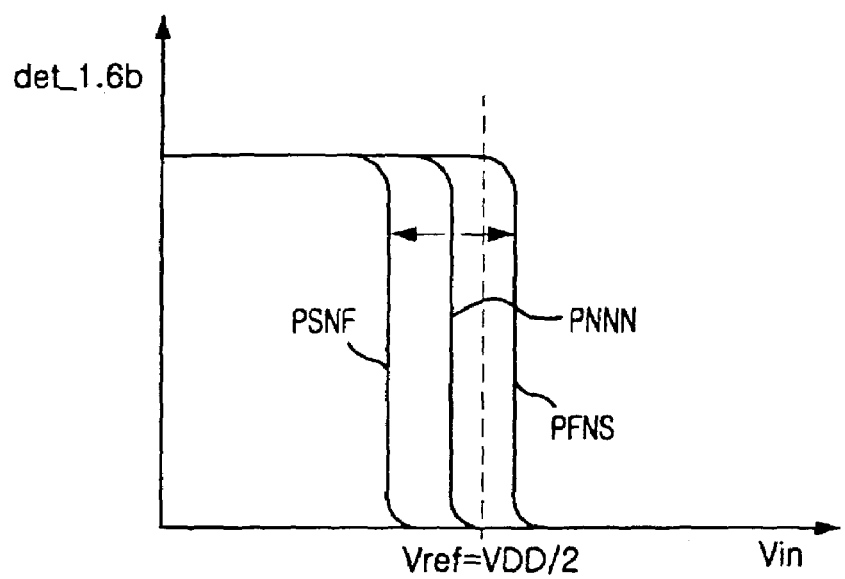
FIGS. 2B and 2C are waveforms illustrating a switching point of the detection circuit of FIG. 2A.
Figure 2C:
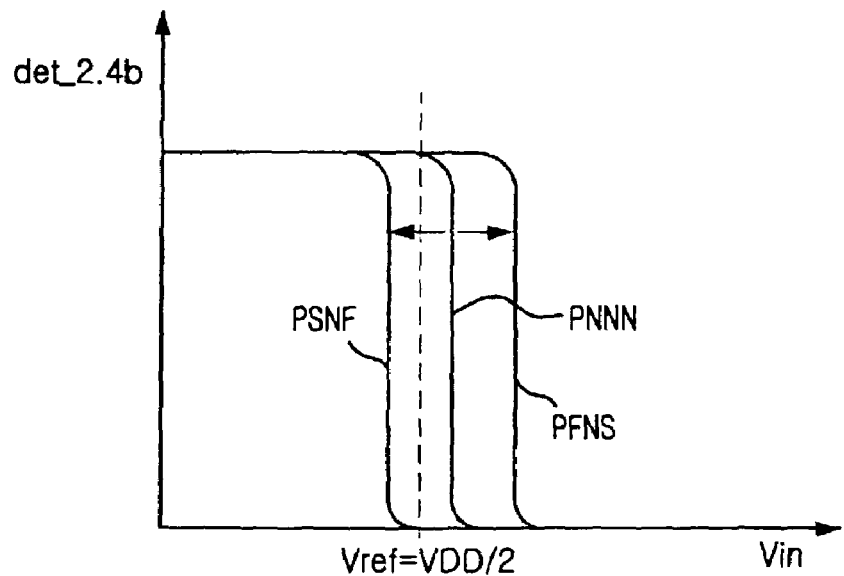

FIGS. 2B and 2C are waveforms illustrating a switching point of the detection circuit in FIG. 2A.

Hereinafter, an operation of the switching point detection circuit will be described by referring to FIGS. 2A to 2C.

Generally, when a channel width of the PMOS transistor becomes twice that of the NMOS transistor for an identical gate voltage and given channel length in the MOS transistor, the same current flows at the channel. For example, when the channel width of the PMOS transistor is 10 μm and the channel width of the NMOS transistor is 5 μm, the same current flows at each channel of the PMOS and NMOS transistors for a given channel length.

Accordingly, if the inverter is fabricated such that the channel width of the PMOS transistor is twice that of the NMOS transistor, the output voltage of the inverter is switched at a half power supply voltage.

Referring to FIG. 2A, when the first resistance R1 and the second resistance R2 have the same resistance value, the reference voltage Vref becomes a half power supply voltage ½ VDD. At this time, if the first CMOS inverter is fabricated to have channel widths of 8 μm and 5 μm for the PMOS and NMOS transistors, respectively, the NMOS transistor MN1 becomes dominant for the reference voltage Vref, which means a current flowing in the NMOS transistor MN1 is higher than that of the PMOS transistor MP1, so that an output det_1.6b of the first inverter 20 becomes a logic low level signal. If the first CMOS inverter is fabricated to have channel widths of 12 μm and 5 μm for the PMOS and NMOS transistors, respectively, the PMOS transistor MP2 becomes dominant for the reference voltage Vref, which means a current flowing in the PMOS transistor MP2 is higher than that of the NMOS transistor MN2, so that an output det_2.4b of the second inverter 30 becomes a logic high level signal.

Considering an operation of the first CMOS inverter 20, if the first CMOS inverter 20 is fabricated identical to the designed inverter, i.e., the PMOS transistor MP1 is an 'N' condition and the NMOS transistor MN1 is an 'N' condition, a waveform showing the switching point may be the 'PNNN' waveform illustrated in FIG. 2B.

Also, if the MOS transistor is fabricated not to be identical to the designed MOS transistor, i.e., the PMOS transistor MP1 is fabricated with an 'S' condition and the NMOS transistor MN1 is fabricated with an 'F' condition, a waveform of the switching point for the first CMOS inverter 20 will be 'PSNF' in FIG. 2B. To the contrary, if the PMOS transistor MP1 is fabricated with 'F' condition and the NMOS transistor MN1 is fabricated with an 'S' condition, a waveform of the switching point for the first CMOS inverter 20 will be 'PFNS' in FIG. 2B.

Therefore, when the PMOS transistor MP1 is fabricated with an 'F' condition and the NMOS transistor MN1 is fabricated with an 'S' condition, an output of the first CMOS inverter 20 is a logic high level signal when the reference voltage Vref, which is VDD/2, is applied. Therefore, the fabrication condition of the first CMOS inverter 20 can be detected.

Hereinafter, considering an operation of the second CMOS inverter 30 will be considered if the MOS transistors are fabricated identical to the designed MOS transistors, i.e., the PMOS transistor MP2 is fabricated with an 'N' condition and the NMOS transistor MN2 is fabricated with an 'N' condition, a waveform of the switching point for the second CMOS inverter 30 will be 'PNNN' in FIG. 2C. Also, if the PMOS transistor MP2 is fabricated with an 'F' condition and the NMOS transistor MN2 is fabricated with an 'S' condition, a waveform of the switching point for the second CMOS inverter 30 will be 'PFNS' in FIG. 2C. To the contrary, if the PMOS transistor MP2 is fabricated with an 'S' condition and the NMOS transistor MN2 is fabricated with an 'F' condition, a waveform of the switching point for the second CMOS inverter 30 will be 'PSNF' in FIG. 2C.

Therefore, when the PMOS transistor MP2 is fabricated with an 'S' condition and the NMOS transistor MN2 is fabricated with an 'F' condition, an output of the second CMOS inverter 30 is a logic low level signal when the reference voltage Vref, which is VDD/2, is applied. Therefore, the fabrication condition of the second CMOS inverter 30 can be detected.

FIG. 3 is a diagram showing a logic table representing operation conditions of the switching point detection circuit in FIG. 2A according to fabrication conditions for the MOS transistor.

As shown, when the reference voltage is applied, if the PMOS transistor P_MOS is fabricated with an 'F' condition and the NMOS transistor N_MOS is fabricated with an 'S' condition, the output det_1.6b of the first inverter 20 is a logic high level 11. If the PMOS transistor P_MOS is fabricated with an 'S' condition and the NMOS transistor N_MOS is fabricated with an 'F' condition, the output det_2.4b of the second inverter 30 is a logic low level 12 when the reference voltage Vref is applied.

By utilizing the outputs of the first and second CMOS inverters 20 and 30, a variation of the switching point according to the fabrication conditions of the CMOS transistor can be detected.

The switching point detection circuit is configured according to two conditions as mentioned above in accordance with one embodiment. However, the switching point detection circuit can also be configured differently by adjusting the channel width of the MOS transistor so that the PMOS transistor is fabricated with an 'N' condition and the NMOS transistor is fabricated with an 'F' condition.

Figure 4:
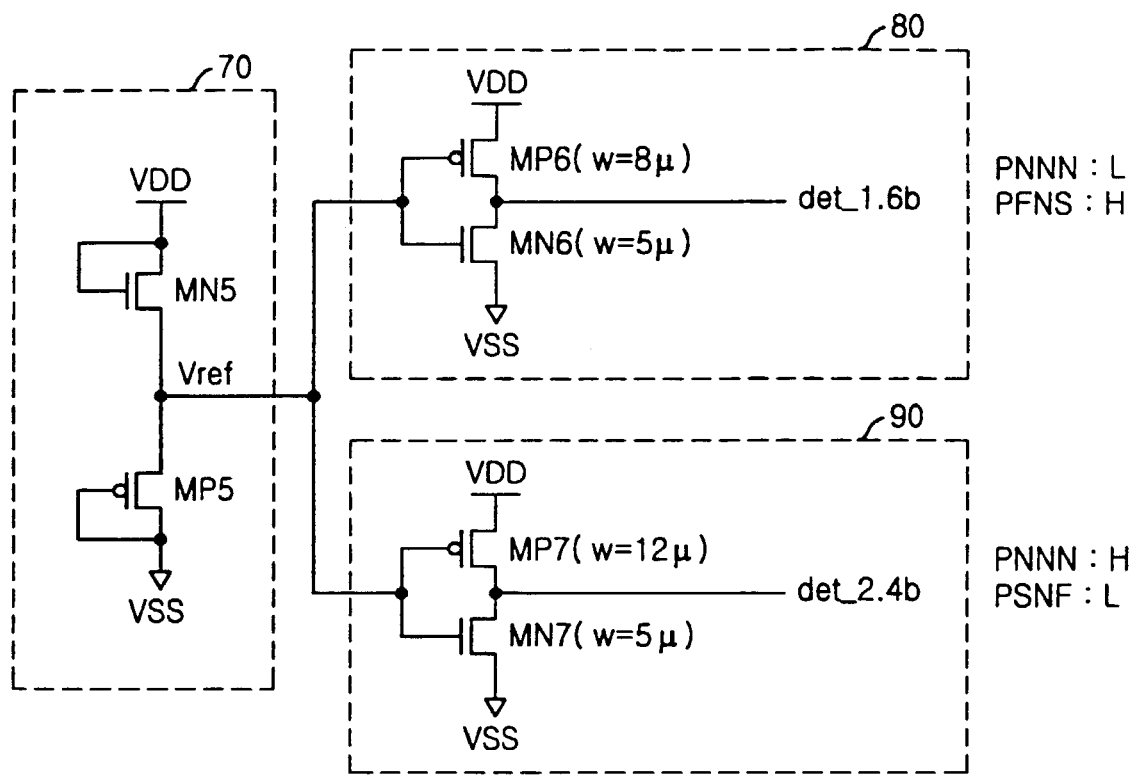
FIG. 4 is a circuit diagram illustrating another switching point detection circuit capable of generating a different reference voltage.

FIG. 4 is a circuit diagram illustrating another switching point detection circuit capable of generating a different reference voltage Vref.

As shown, a reference voltage generator 70 includes a fifth NMOS transistor MN5 whose gate and drain are coupled to each other and a fifth PMOS transistor MP5 whose gate and drain are coupled to each other. The fifth NMOS transistor MN5 and the fifth PMOS transistor MP5 are coupled in series between the power supply voltage VDD and the ground voltage VSS. The difference between the switching point detection circuit in FIG. 4 and the switching point detection circuit in FIG. 2A is the manner in which the reference voltage is generated.

When the PMOS transistor MP5 is an 'F' condition and the NMOS transistor MN5 is an 'S' condition in the reference voltage generation unit 70, the reference voltage level Vref is lower than the VDD/2 level. Therefore, if the PMOS transistor MP6 and the NMOS transistor MN6 are fabricated with an 'N' condition in the first CMOS inverter 80, the switching point waveform moves from 'PNNN' to 'PFNS' in FIG. 2A since the reference voltage Vref is lower than the VDD/2. Accordingly, the first CMOS inverter 80 outputs a signal in a logic high level.

Also, when the PMOS transistor MP5 is an 'S' condition and the NMOS transistor MN5 is an 'F' condition in the reference voltage generation unit 70, the reference voltage level Vref is higher than the VDD/2 level. Therefore, if the PMOS transistor MP7 and the NMOS transistor MN6 are fabricated with an 'N' condition in the second CMOS inverter 90, the switching point waveform moves from 'PNNN' to 'PSNF' in FIG. 2C since the reference voltage Vref is higher than the VDD/2. Accordingly, the second CMOS inverter 90 outputs a signal in a logic low level.

Figure 5:
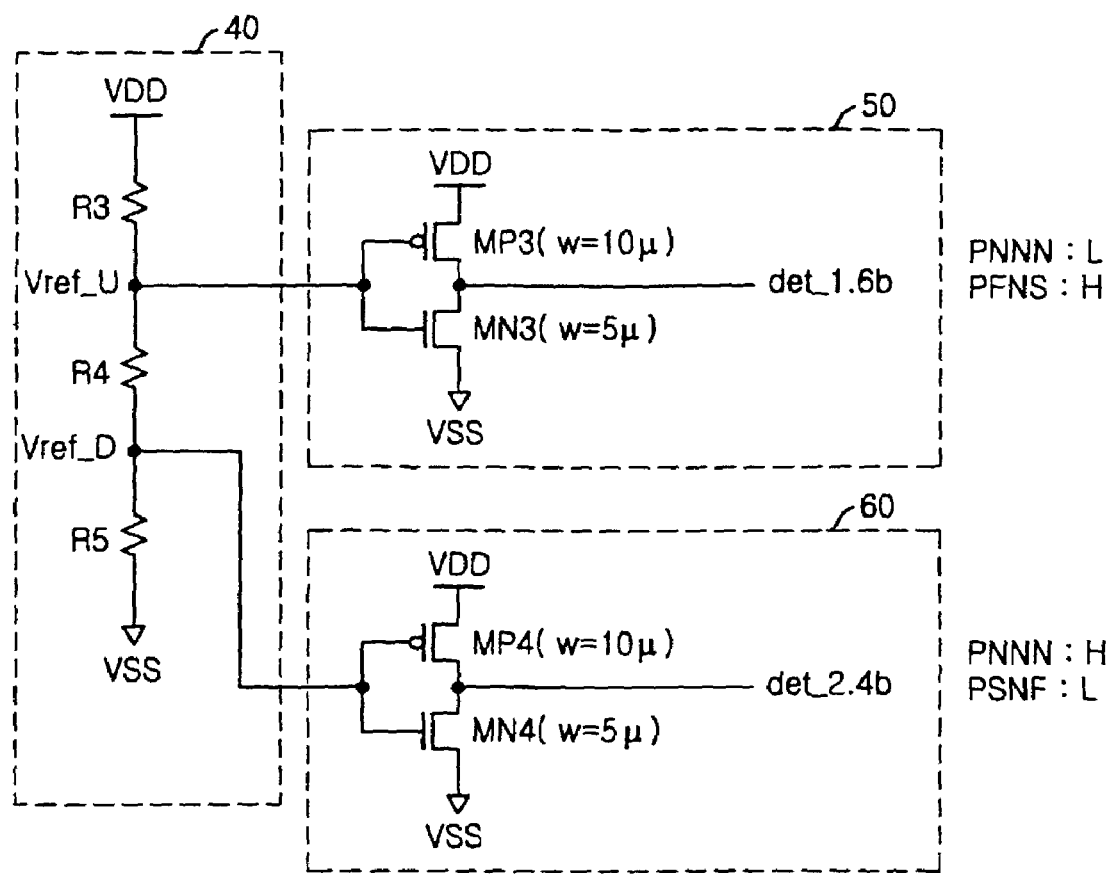
FIGS. 5 and 6 are circuit diagrams illustrating another switching point detection circuits.
Figure 6:
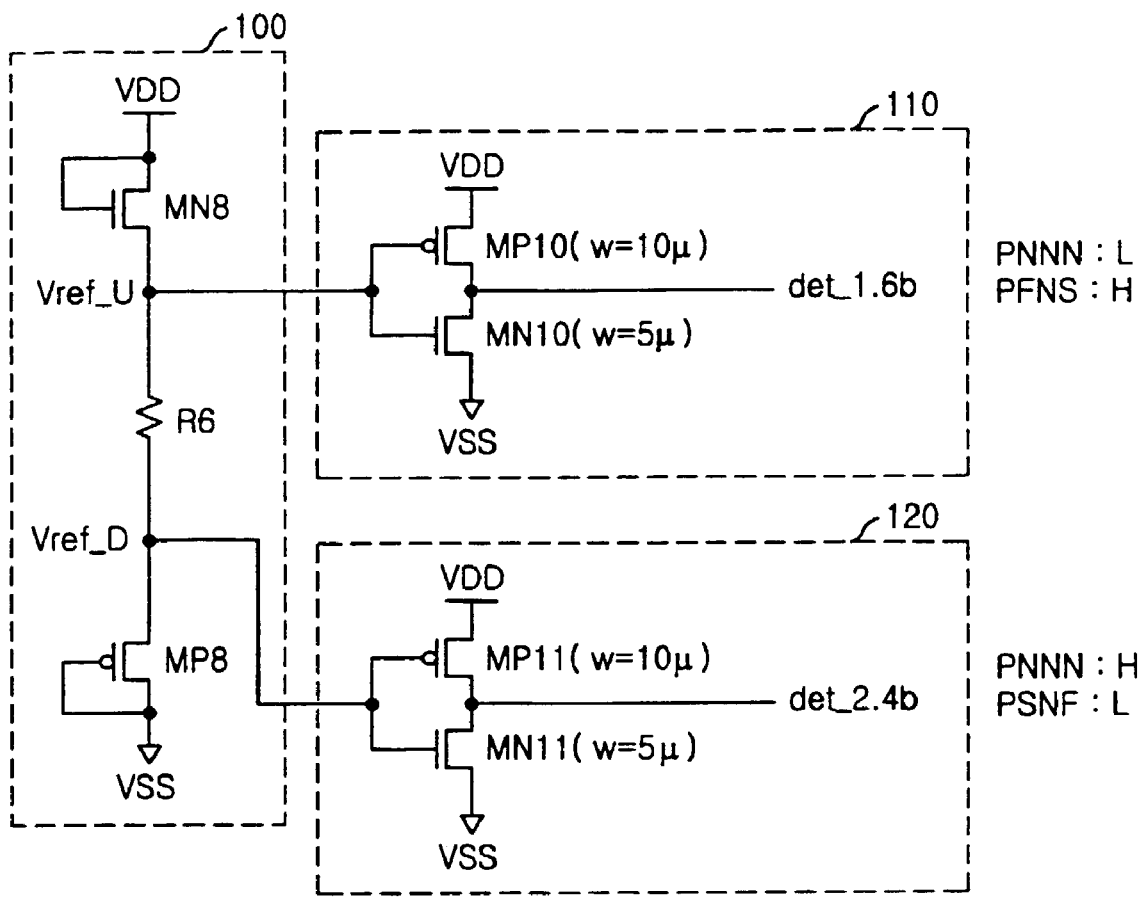
Figure 7A:
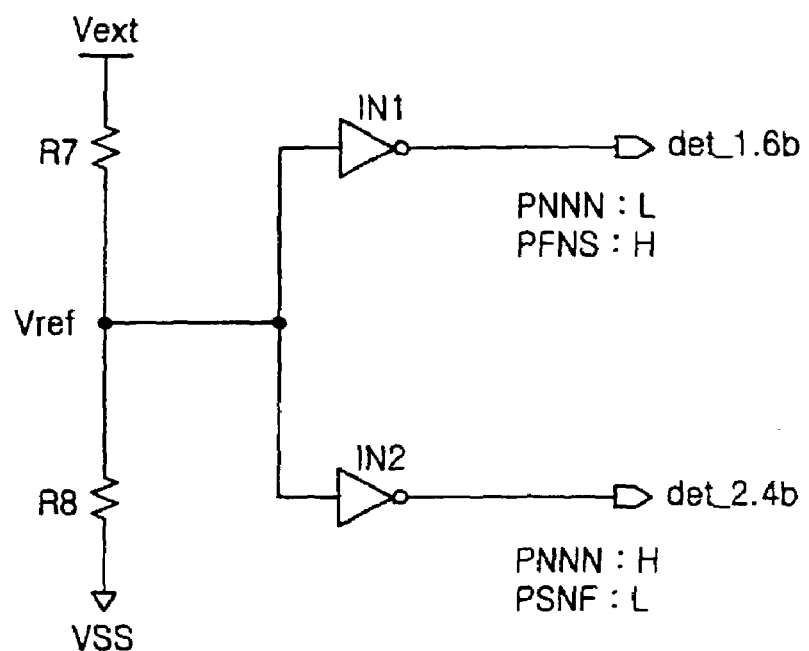
FIGS. 7A to 7D are circuit diagrams showing various methods for generating the reference voltage.
Figure 7B:
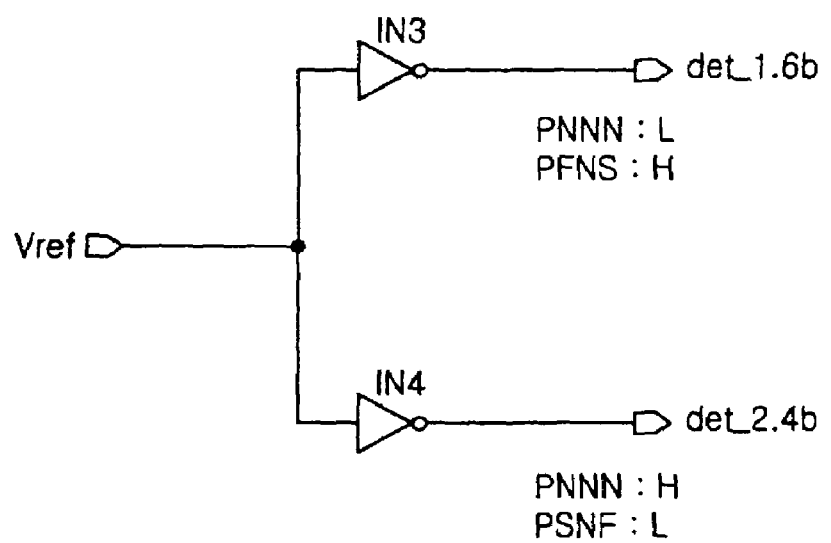
Figure 7C:
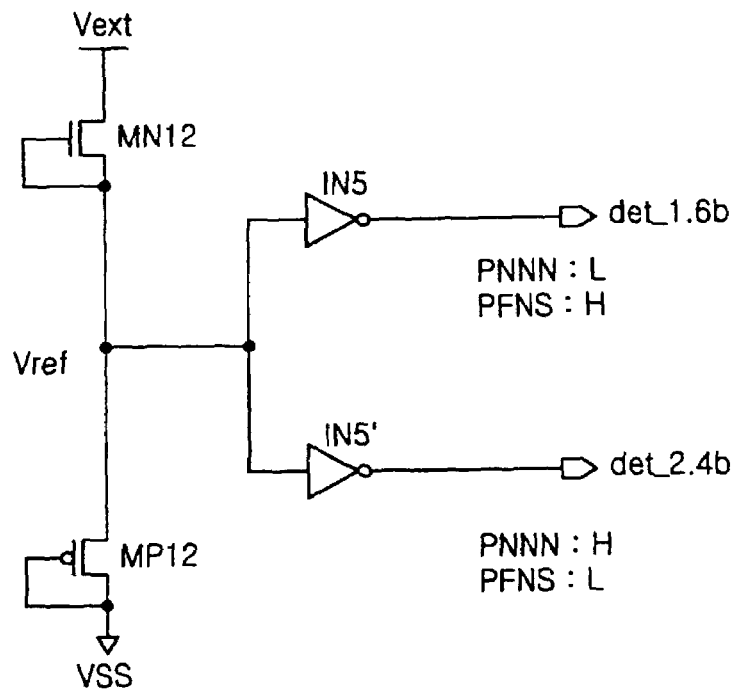
Figure 7D:
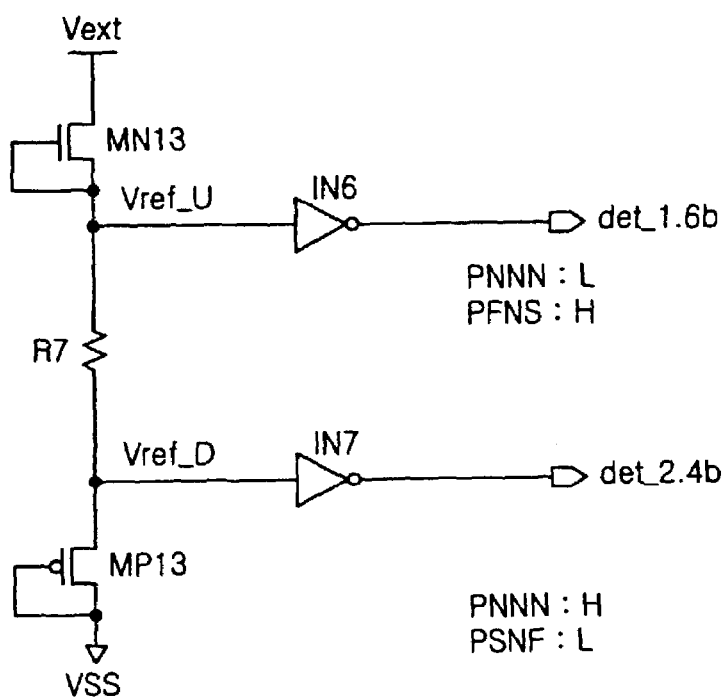

FIGS. 5 and 6 are circuit diagrams illustrating another switching point detection circuit in accordance with the present disclosure.

Referring to FIG. 5, the switching point detection circuit includes a reference voltage generation unit 40, a first CMOS inverter 50 and a second CMOS inverter 60. The reference voltage generation unit 40 includes a third resistance R3, a fourth resistance R4 and a fifth resistance R5, all of which are coupled in series between the power supply voltage VDD and the ground voltage VSS. The reference voltage generation unit 40 generates a first reference voltage Vref_U, which is a higher voltage than the VDD/2, and a second reference voltage Vref_D, which is a lower voltage than the VDD/2. The first and second CMOS inverters 50 and 60 have a switching point at the half power supply voltage VDD/2, and the first and second reference voltages Vref_U and Vref_D are applied as input voltages to the first CMOS inverter 50 and the second CMOS inverter 60, respectively. The switching point detection circuit in FIG. 5 can detect the switching point variation according to fabrication conditions of the MOS transistors at the first and second reference voltages Vref_U and Vref_D.

The first reference voltage Vref_U is generated at a common node of the third resistance and the fourth resistance, and the second reference voltage Vref_D is generated at a common node of the fourth resistance and the fifth resistance.

Because the PMOS transistors and the NMOS transistors of the first inverter 50 and the second inverter 60 are fabricated with a width ratio of 2:1, the switching point is formed at the half power supply voltage VDD/2. When the resistances R3, R4 and R5 have the same resistance value, the first reference voltage Vref_U has a ⅔ VDD level and the second reference voltage Vref_D has a ⅓ VDD level, so that the first CMOS inverter 50 outputs a signal in a logic low level and the second CMOS inverter 60 outputs a signal in a logic high level. The exact voltage level of ⅔ VDD or ⅓ VDD is not important. It is important that the reference voltage Vref_U has a higher voltage level than the ½ VDD level and that the reference voltage Vref_D has a lower voltage level than the ½ VDD level.

If the PMOS transistor MP3 has an 'F' condition and the NMOS transistor MN3 has an 'S' condition in the first CMOS inverter 50, the first CMOS inverter 50 outputs a signal in a logic high level. If the PMOS transistor MP4 has an 'S' condition and the NMOS transistor MN4 has an 'F' condition, the second CMOS inverter 60 outputs a signal in a logic low level. Therefore, by detecting the outputs of each inverter, a manufacturing condition can be determined.

Referring to FIG. 6, the third and fourth resistors are replaced with transistors MN8 and MP8, respectively. The actual operation of the switching point detection circuit in FIG. 6 is similar to that of the switching point detection circuit of FIG. 5.

FIGS. 7A to 7D are circuit diagrams showing various methods for generating the reference voltage.

As shown, an external power supply voltage Vext is employed as the operation voltage instead of the VDD in the switching point detection circuit shown in FIGS. 2A, 4 to 6.

Figure 8A:
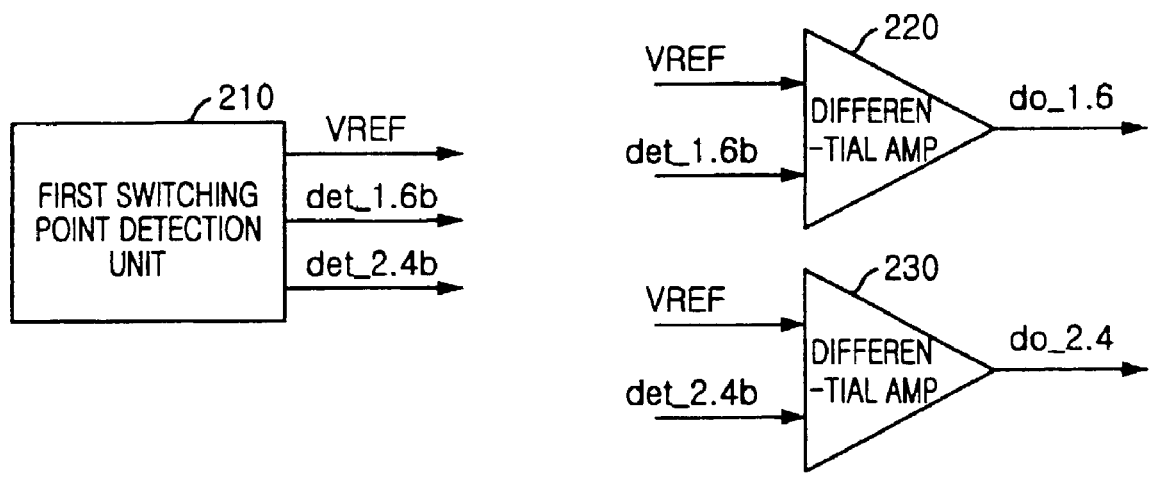
FIGS. 8A and 8B are schematic diagrams illustrating switching point detection circuits having a differential amplifier.
Figure 8B:
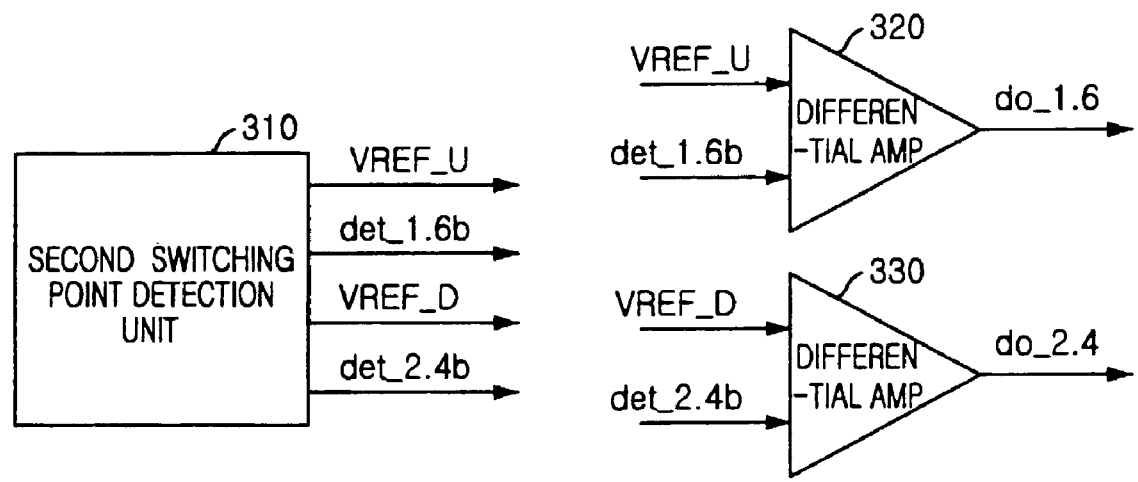
Figure 8C:
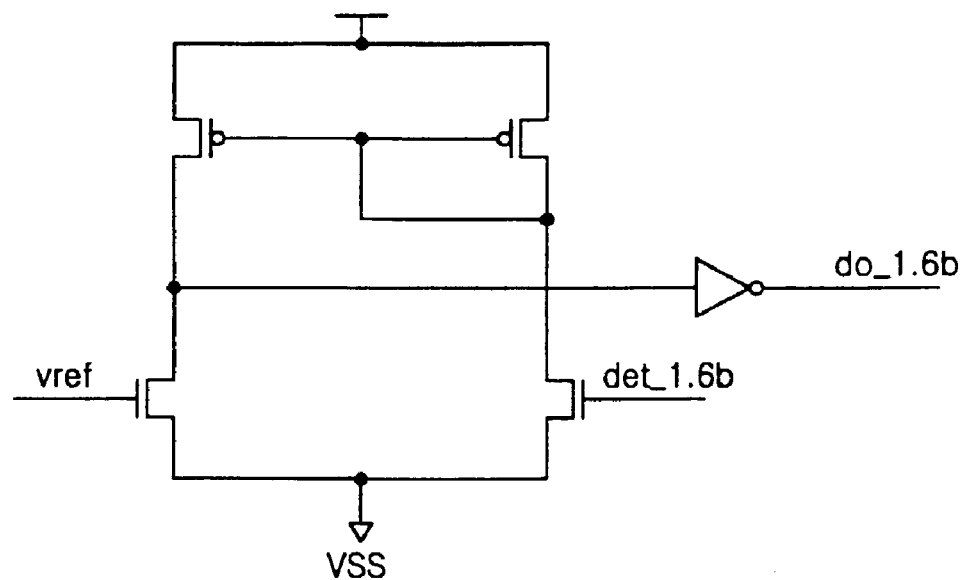
FIGS. 8C to 8F are circuit diagrams illustrating the differential amplifier commonly applied in FIGS. 8A and 8B.
Figure 8D:
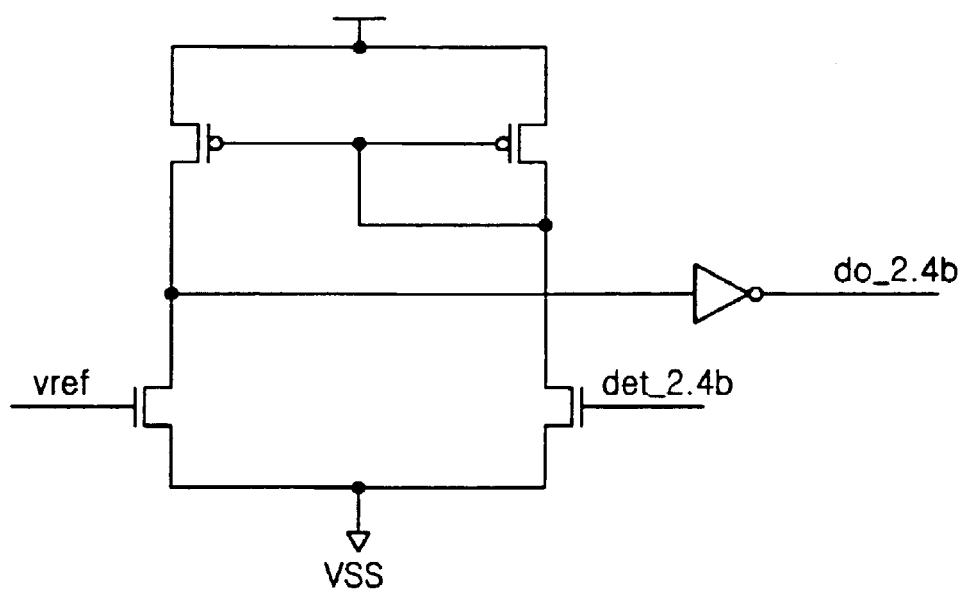
Figure 8E:
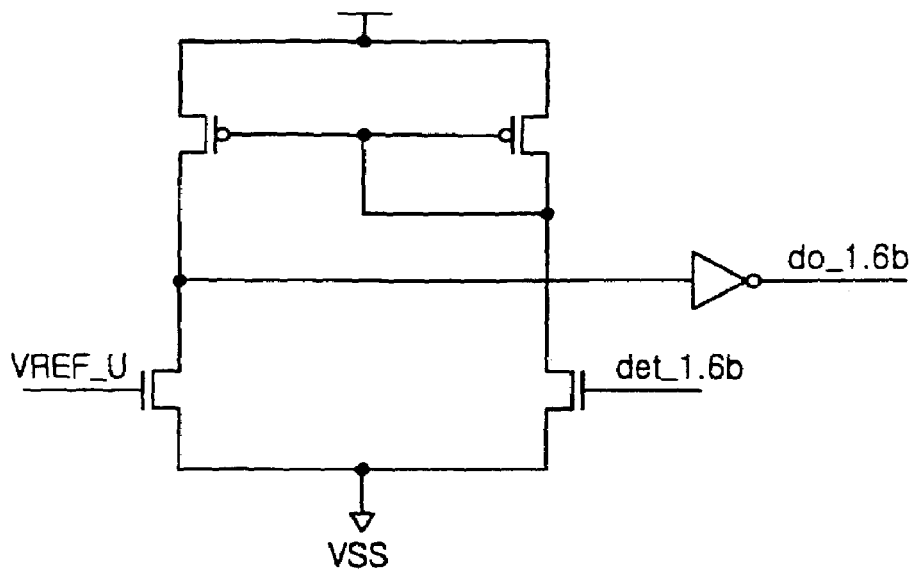
Figure 8F:
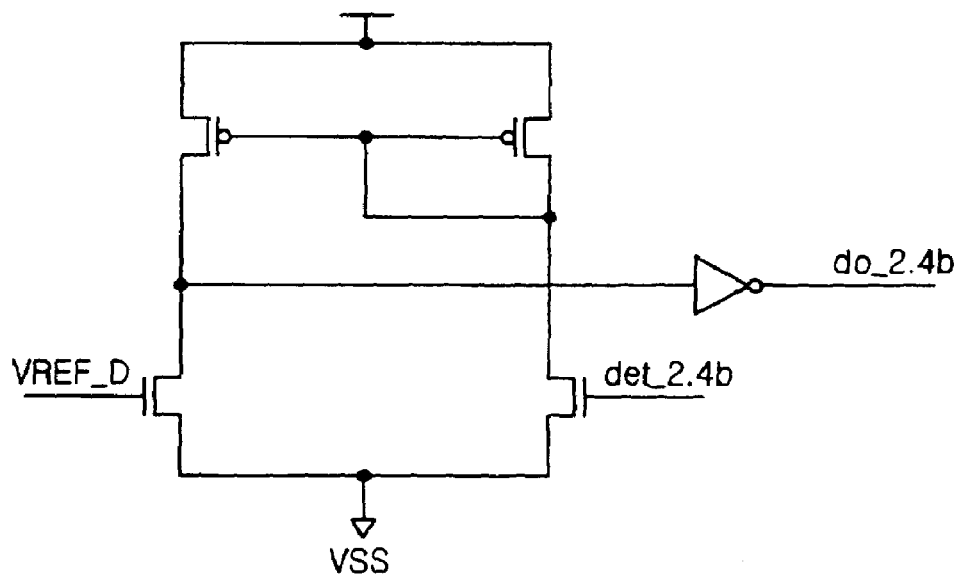

FIGS. 8A and 8B are schematic diagrams illustrating switching point detection circuits having a differential amplifier. Since the output signal of the switching point detection circuit is very weak, the differential amplifier is added to amplify the output of the disclosed switching point detection circuit.

Referring to FIG. 8A, two differential amplifiers 220 and 230 are added at output terminals of the switching point detection circuit in FIGS. 2A and 4, respectively.

Referring to FIG. 8B, two differential amplifiers 320 and 330 are added at output terminals of the switching point detection circuit shown in FIGS. 5 and 6, respectively.

FIGS. 8C to 8F are circuit diagrams illustrating the differential amplifier commonly applied in FIGS. 8A and 8B. The reference voltage generated from the reference voltage generation unit, i.e., VREF, VREF_U or VREF_D is applied to one input terminal and the output signal of the switching point detection circuit, i.e., det__1.6b or det__2.4b is applied to the other input terminal in the differential amplifier.

Figure 9A:
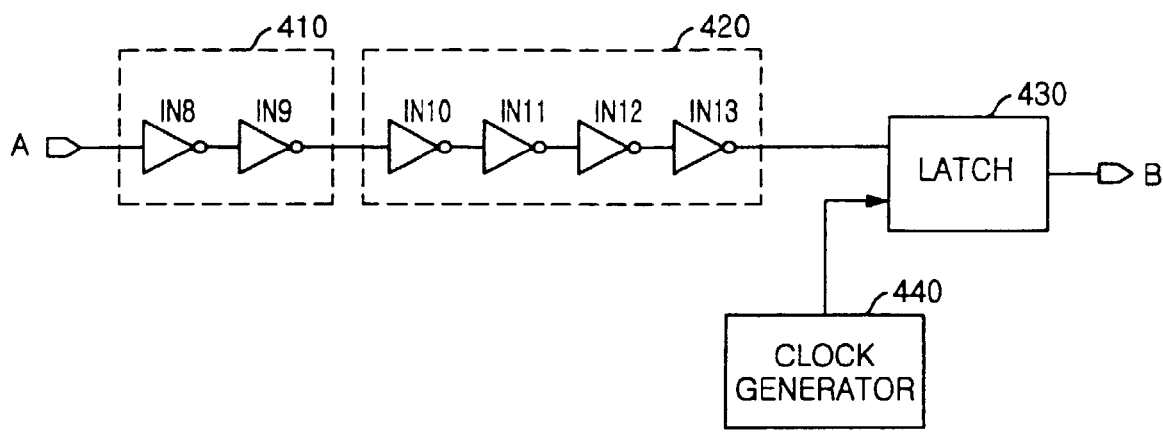
FIG. 9A is a circuit diagram showing a conventional input buffer.

FIG. 9A is a circuit diagram showing a conventional input buffer.

As shown, the input buffer includes an input buffering unit 410, a delay unit 420, a latch 430 and a clock generator 440. The input buffering unit 410 receives an input signal A and the delay unit 420 delays an output of the input buffering unit 410. The latch 430 synchronizes an output signal of the delay unit 420 with a clock signal generated from the clock generator 440 and outputs an intern signal B. However, if the input buffer is configured as in FIG. 9A, a voltage level of the input signal may be varied according to a fabrication condition of the NMOS and PMOS transistors, so that operational reliability of the semiconductor device may be secured.

FIG. 9B is a circuit diagram illustrating an input buffer having a switching point detection circuit in accordance with the present disclosure.

As shown, the input buffer is capable of adjusting a switching point by detecting a fabrication condition and includes a switching point detection circuit consisting of a first CMOS inverter 491, in which an NMOS transistor is dominant for a reference voltage Vref and a second CMOS inverter 492, in which a PMOS transistor is dominant for the reference voltage Vref. The input buffer further includes a buffering unit 450 for receiving and buffering an input signal A, a delay unit 460 for transmitting and delaying an output signal of the buffering unit 450 in response to output signals of the first CMOS inverter 491 and the second CMOS inverter 492, a latch unit 470 for latching an output signal of the delay unit 460 and a clock generation unit 480 for inputting a clock signal to the latch unit 470.

The delay unit 460 includes a first delay 461 for delaying the output signal of the buffering unit 450 by a first predetermined time, a first multiplexer 462 for selectively outputting the output signal of the buffering unit 450 or an output signal of the first delay 461 in response to the output signal of the first CMOS inverter 491, a second delay 463 for delaying an output signal of the first multiplexer 462 by a second predetermined time, a third delay 464 for delaying an output signal of the second delay 463 and a second multiplexer 465 for selectively outputting the output signal of the second delay 463 or an output signal of the third delay 464. Herein, the reference voltage can be generated with the methods described with respect to FIGS. 4 to 6.

Hereinafter, an operation of the input buffer illustrated in FIG. 9B will be described. The reference voltage Vref is stably outputted with the half power supply voltage, and the output signals of the first CMOS inverter 491 are determined according to a fabrication condition of the NMOS transistor and PMOS transistor. A delay of the input signal A is adjusted by selectively passing the first delay 461 and the third delay 464 according to the output signals of the first and second CMOS inverters 491 and 492.

Accordingly, even though the fabrication condition of the MOS transistor varies, an output signal for an input signal can be uniformly maintained so that reliability of the operation of the semiconductor device is secured.

Figure 10:
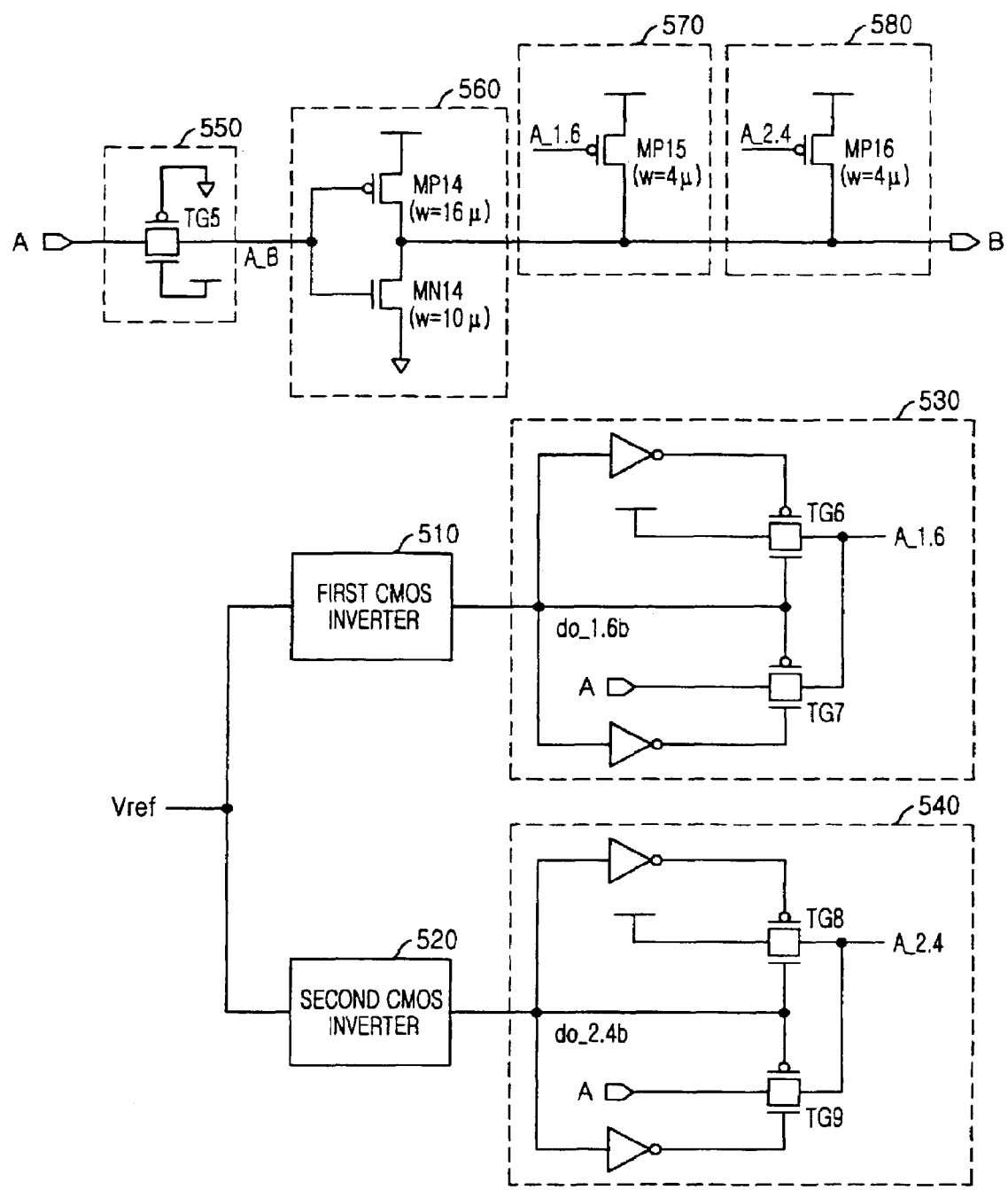
FIG. 10 is a circuit diagram illustrating a disclosed semiconductor device having a switching point detection circuit.

FIG. 10 is a circuit diagram of a semiconductor device having a switching point detection circuit in accordance with the present disclosure.

As shown, the semiconductor device includes a switching point detection circuit, a first multiplexer 530, a second multiplexer 540, a buffering unit 550, a third CMOS inverter 560, a first pull-up unit 570 and a second pull-up unit 580.

The switching point detection circuit includes a first CMOS inverter 510, in which an NMOS transistor is dominant for the reference voltage, and a second inverter 520, in which a PMOS transistor is dominant for the reference voltage. The first multiplexer 530 selectively outputs the power supply voltage or the input signal A according to an output signal of the first CMOS inverter 510, and the second multiplexer 540 selectively outputs the power supply voltage or the input signal A according to an output signal of the second CMOS inverter 520. The buffering unit 550 receives the input signal A and the third CMOS inverter 560 inverts an output signal A_B of the buffering unit 550. The first pull-up unit 570 performs a pull-up operation for an output of the third inverter 560 according to an output signal of the first multiplexer 530, and the second pull-up unit 580 performs a pull-up operation for an output of the third inverter 560 according to an output signal of the second multiplexer 540.

The first multiplexer 530 includes a first transfer gate TG6, which is turned on when the output signal of the first CMOS inverter 510 is in a first logic state, coupled to the power supply voltage and a second transfer gate TG7, which is turned on when the output signal of the first CMOS inverter 510 is in a second logic state, coupled to the input signal A. The second multiplexer 540 includes a third transfer gate TG8, which is turned on when the output signal of the second CMOS inverter 520 is in a first logic state, coupled to the power supply voltage and a fourth transfer gate TG9, which is turned on when the output signal of the second CMOS inverter 520 is a second logic state, coupled to the input signal A.

The buffering unit 550 consists of a transfer gate TG5, which is always turned on, for setting timing for transferring the input signal to the third CMOS inverter 560 and for operating the first and a second pull-up units 570 and 580. Output signals of the first and second CMOS inverter 510 and 520 are determined by the fabrication condition of the NMOS transistor and the PMOS transistor. Outputs of the first and second multiplexers 530 and 540 are determined by the output signals of the first and second CMOS inverters 510 and 520, respectively. The first and second pull-up units 570 and 580 are operated in response to the output signals of the first and second multiplexers 530 and 540, respectively.

An output waveform of the input signal A is determined by the first and second pull-up units 570 and 580. Accordingly, a stable output signal can be transmitted to an internal circuit without variation of a fabrication condition of a MOS transistor.

Figure 11:
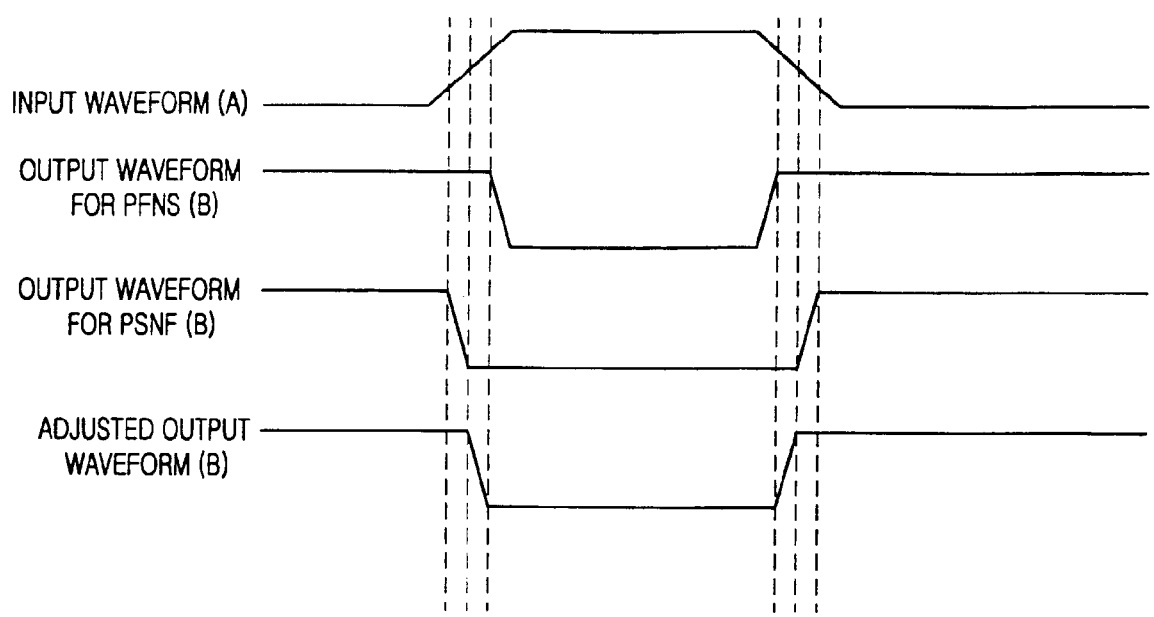
FIG. 11 is a waveform illustrating an operation of the semiconductor device of FIG. 10.

FIG. 11 is a waveform illustrating an operation of the semiconductor device in FIG. 10.

As shown, when the switching point detection circuit is not employed according to the prior art, an output waveform B for an input waveform A is varied according to a fabrication condition of a MOS transistor, such as a waveform at a PFNS condition or a waveform at a PSNF condition shown in FIG. 11. However, when the switching point detection circuit is employed in accordance with the present invention, an output form for the input signal can be stabilized as shown in an output waveform, which the switching point is adjusted.

Figure 12A:
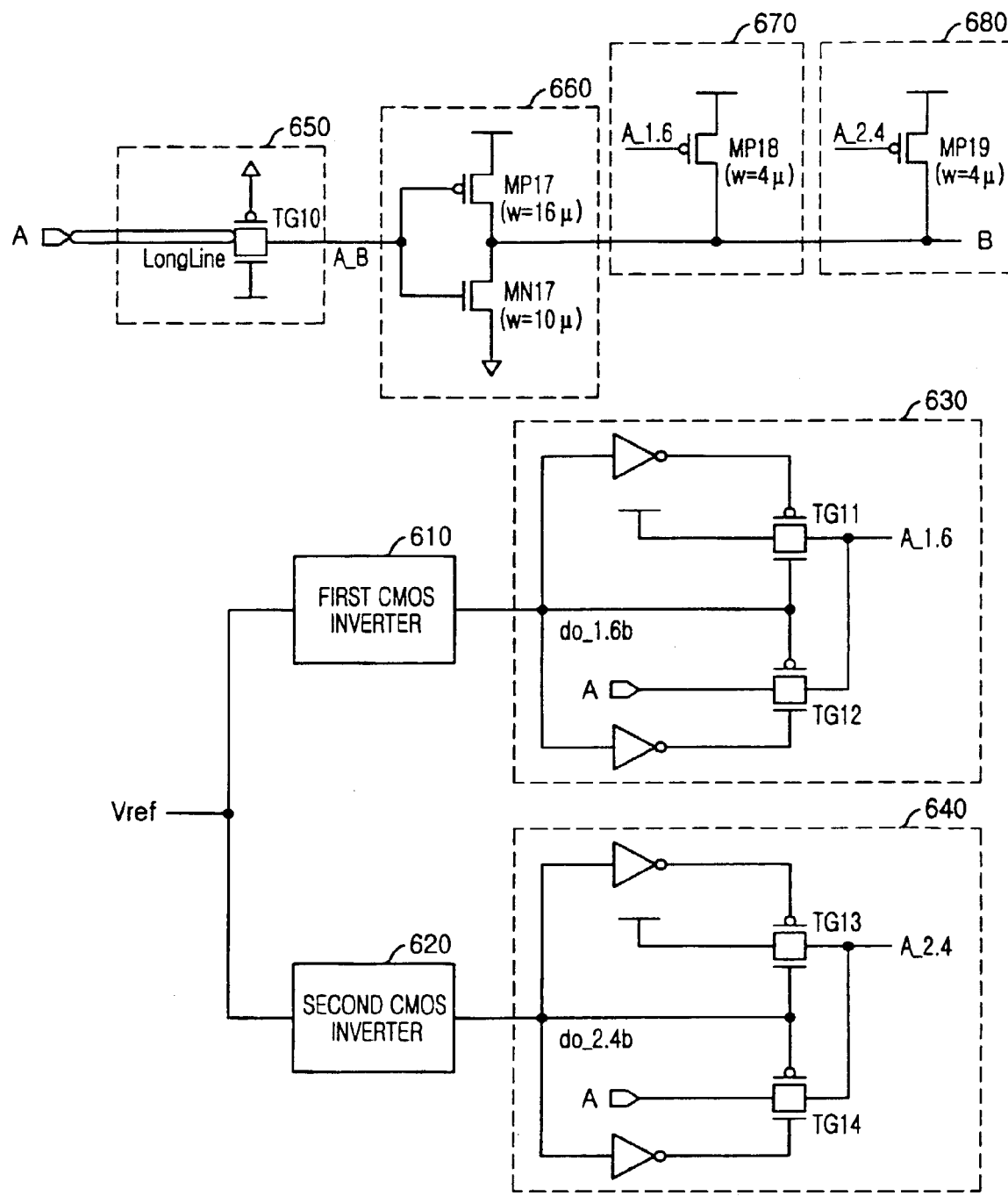
FIG. 12A is a circuit diagram illustrating a semiconductor device, in which a long line having a high load is coupled to an input signal of the input buffer.
Figure 12B:
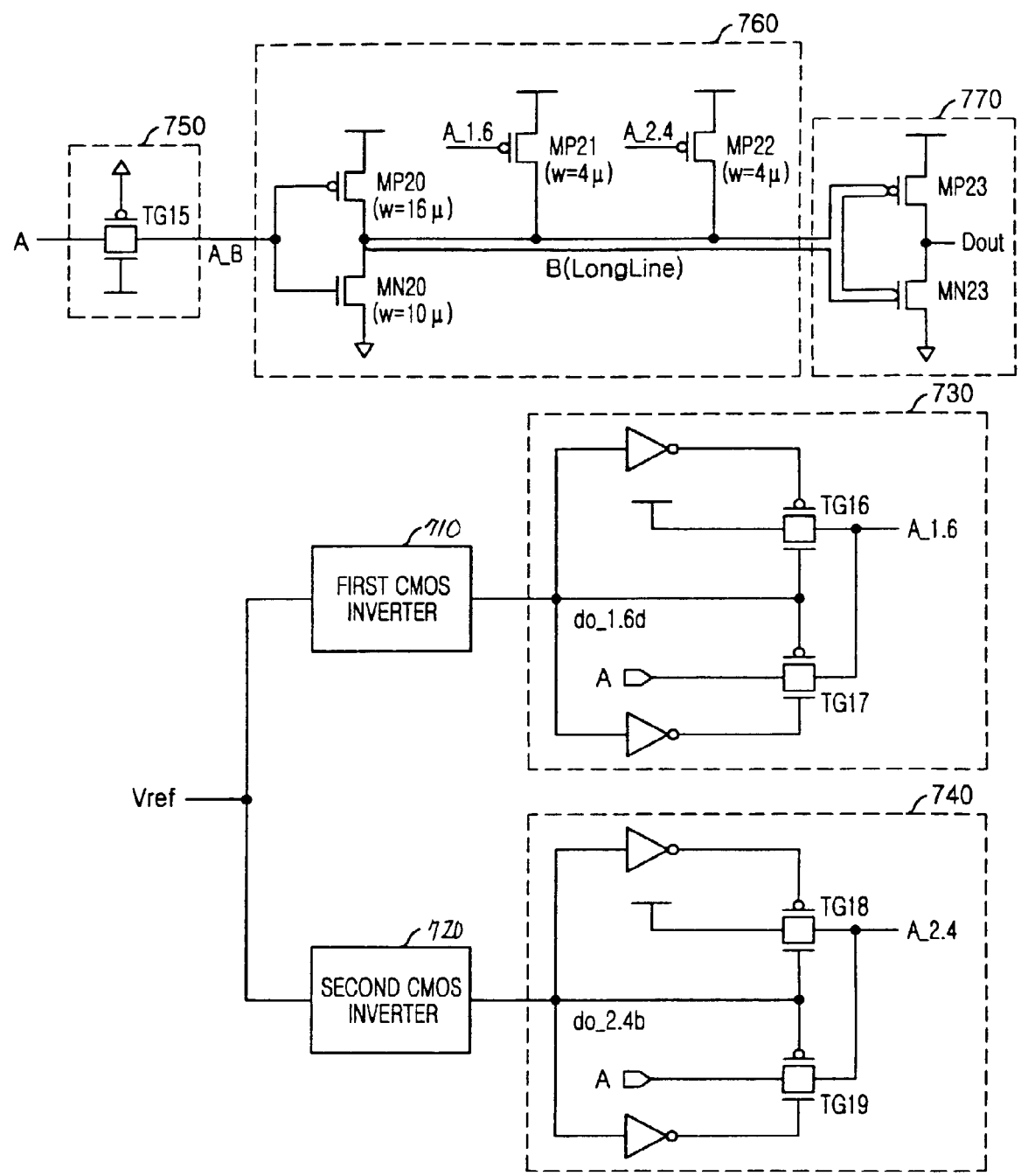
FIG. 12B is a circuit diagram illustrating a semiconductor device, in which a long line having a high load is coupled to an output signal of the output buffer.

FIG. 12A is a circuit diagram illustrating a semiconductor device, in which a long line having a high load is coupled to an input signal of the input buffer, and FIG. 12B is a circuit diagram illustrating a semiconductor device, in which a long line having a high load is coupled to an output signal of the output buffer.

Generally, the semiconductor device is fabricated to have a long line at an input or an output of the input buffer to reduce a noise of the input signal. Since operation of the high load is largely affected by a fabrication condition of the semiconductor, reliability of the operation of the semiconductor device deteriorates. Therefore, as the variation according to the fabrication condition of the MOS transistor is adjusted by the switching point detection circuit in accordance with the present disclosure, even if the fabrication condition of the MOS transistor is varied, a stable output signal for an input signal can be transmitted. Therefore, operational reliability does not deteriorate.

Figure 12C:
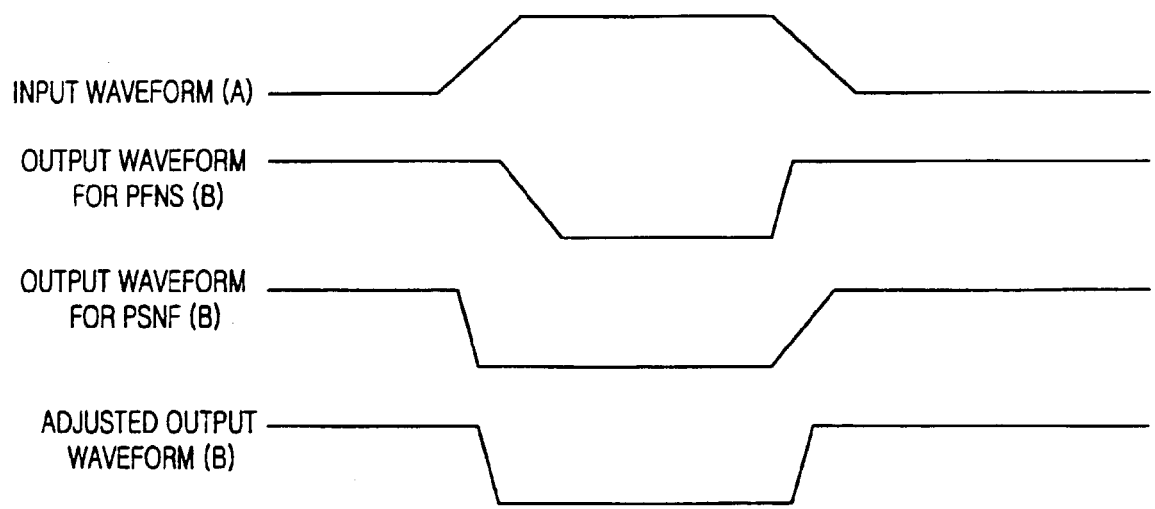
FIG. 12C is a waveform showing operations of the semiconductor devices illustrated in FIGS. 12A and 12B.

FIG. 12C is a waveform showing operations of the semiconductor devices illustrated in FIGS. 12A and 12B.

As shown, when the switching point detection circuit is not employed according to the prior art, an output waveform B for an input waveform A varies according to the fabrication condition of a MOS transistor, such as a waveform at a 'PFNS' condition or a waveform at a 'PSNF' condition shown in FIG. 12C. However, when the switching point detection circuit in accordance with the present disclosure is employed, an output waveform for the input signal can be stabilized as shown in the adjusted output waveform B.

Accordingly, as the semiconductor device includes a disclosed switching point detection circuit capable of detecting a fabrication condition of the MOS transistor, an operational error can be reduced, so that operational reliability of the semiconductor device can be improved.

While the disclosed circuits and devices have been described with respect to the particular embodiments, it will be apparent to those skilled in the art that various changes and modifications may be made without departing from the spirit and scope of this disclosure which is limited only by the following claims.

What is claimed is:

1. A switching point detection circuit for detecting a switching point according to a fabrication condition of a metal oxide semiconductor (MOS) transistor, the switching point detection circuit comprising:
   a reference voltage generation circuit for generating a reference voltage;
   a first inverter for inverting the reference voltage to generate a first output the first inverter having a first p-type metal oxide semiconductor (PMOS) transistor and a first n-type metal oxide semiconductor (NMOS) transistor, wherein a gate of the first PMOS transistor is coupled to a gore of the first NMOS transistor; and
   a second inverter for inverting the reference voltage to generate a second output, the second inverter having a second PMOS transistor and a second NMOS transistor, wherein a gate of the second PMOS transistor is coupled to a gate of the second NMOS transistor;
   a first differential amplifier for receiving the first reference voltage and the first output of the first inverter circuit; and
   a second differential amplifier for receiving the second reference voltage and the second output of the second inverter circuit,
   wherein the first NMOS transistor is dominant over the first PMOS transistor and the second PMOS transistor is dominant over the second NMOS transistor according to the fabrication condition and a logic level of the first output and a logic level of the second output provides a determination of the fabrication condition.

2. The switching point detection circuit as recited in claim 1, wherein the dominant transistor in each of the first inverter and the second inverter is determined by the size of each of the first PMOS transistor, the first NMOS transistor, the second PMOS transistor and the second NMOS transistor.

3. The switching point detection circuit as recited in claim 1, wherein the reference voltage generation circuit generates the reference voltage by using resistances.

4. The switching point detection circuit as recited in claim 1, wherein the reference voltage generation circuit includes:
an NMOS transistor, a gate and a drain of the NMOS transistor being coupled to a power supply voltage; and
a PMOS transistor connected between the NMOS transistor and a ground voltage, a gate of the PMOS transistor being coupled to the ground voltage.

5. The switching point detection circuit as recited in claim 1, further comprising:
a first differential amplifier for receiving the reference voltage and the first output of the first inverter; and
a second differential amplifier for receiving the reference voltage and the second output of the second inverter.

6. A switching point detection circuit for detecting a switching point according to a fabrication condition of a MOS transistor, the switching point detection circuit comprising:
a reference voltage generation circuit for generating a first reference voltage and a second reference voltage, the first reference voltage being higher than a half power supply voltage, and the second reference voltage being lower than the half power supply voltage;
a first inverter for inverting the reference voltage to generate a first output, the first inverter having a first p-type metal oxide semiconductor (PMOS) transistor and a first n-type metal oxide semiconductor (NMOS) transistor, wherein a gate of the first PMOS transistor is coupled to a gate of the first NMOS transistor, and
a second inverter for inverting the reference voltage to generate a second output, the second inverter having a second PMOS transistor and a second NMOS transistor, wherein a gate of the second PMOS transistor is coupled to a gate of the second NMOS transistor;
a first differential amplifier for receiving the first reference voltage and first output of the first inverter circuit; and
a second differential amplifier for receiving the second reference voltage and the second output of the second inverter circuit,
wherein the switching point of each of the first inverter and the second inverter is at the half power supply voltage for controlling a logic level of the first output and the second output.

7. The switching point detection circuit as recited in claim 6, wherein the reference voltage generation circuit includes first, second and third resistances coupled in series between a power supply voltage and a ground voltage, wherein the first reference voltage is generated at a junction node of the first resistance and the second resistance, and the second reference voltage is generated at a junction node of the second resistance and the third resistance.

8. The switching point detection circuit as recited in claim 6, wherein the reference voltage generation circuit includes:
an NMOS transistor, a gate of the NMOS transistor being coupled to a power supply voltage;
a resistance coupled to the NMOS transistor; and
a PMOS transistor coupled between the resistance and a ground voltage, a gate of the PMOS transistor being coupled to the ground voltage, wherein the first reference voltage is generated at a junction node of the NMOS transistor and the resistance, and the second reference voltage is generated at a junction node of the resistance and the PMOS transistor.

9. The switching point detection circuit as recited in claim 6, wherein a logic level of the first output and a logic level of the second output provides a determination of the fabrication condition.

10. A semiconductor device comprising:
a buffering circuit for buffering an input signal;
a switching point detection circuit for detecting a switching point variation of a MOS inverter according to a fabrication condition of a MOS transistor; and
a delay circuit for delaying the input signal outputted from the buffering circuit under control of the switching point detection circuit,
wherein the switching point detection circuit includes:
a reference voltage generation circuit for generating a reference voltage;
a first MOS inverter circuit for receiving the reference voltage and generating a first output signal; and
a second MOS inverter circuit for receiving the reference voltage and generating a second output signal, wherein an NMOS transistor is dominant for the reference voltage in the first MOS inverter circuit and a PMOS transistor is dominant for the reference voltage in the second MOS inverter circuit.

11. The semiconductor device as recited in claim 10, wherein the delay circuit includes:
a first delay for delaying the input signal by a first predetermined time;
a first multiplexer for selectively outputting an output signal of the buffering circuit or an output signal of the first delay according to the first output signal of the first MOS inverter circuit;
a second delay for delaying an output signal of the first multiplexer by a second predetermined time;
a third delay for delaying an output signal of the second delay; and
a second multiplexer for selectively outputting the output signal of the second delay or an output signal of the third delay according to the second output signal of the second MOS inverter circuit.

12. A semiconductor device comprising:
a switching point detection circuit for detecting a switching point variation of a MOS inverter according to a fabrication condition of a MOS transistor, the switching point detection circuit comprising:
a reference voltage generation circuit for generating a reference voltage;
a first MOS inverter circuit for receiving the reference voltage, an NMOS transistor being a dominant transistor for the reference voltage in the first MOS inverter circuit; and
a second MOS inverter circuit for receiving the reference voltage, a PMOS transistor being a dominant transistor for the reference voltage in the second MOS inverter circuit;
a first multiplexer for selectively outputting a power supply voltage or an input signal according to an output signal of the first MOS inverter circuit;
a second multiplexer for selectively outputting the power supply voltage or the input signal according to an output signal of the second MOS inverter circuit;
a third MOS inverter circuit for inverting the input signal;

a first pull-up circuit for performing a first pull-up operation for an output of the third MOS inverter circuit according to an output signal of the first multiplexer; and a second pull-up circuit for performing a second pull-up operation for an output of the third MOS inverter circuit according to an output signal of the second multiplexer.

13. The semiconductor device as recited in claim 12, wherein the third MOS inverter circuit receives the input signal through a transfer gate.

14. The semiconductor device as recited in claim 12, wherein the first multiplexer includes:
   a first transfer gate coupled to the power supply voltage, the first transfer gate of the first multiplexer being turned on when the output signal of the first MOS inverter circuit is in a first logic state; and
   a second transfer gate coupled to the input signal, the second transfer gate of the first multiplexer being turned on when the output signal of the first MOS inverter circuit is in a second logic state.

15. The semiconductor device as recited in claim 12, wherein the second multiplexer includes:
   a first transfer gate coupled to the power supply voltage, the first transfer gate of the second multiplexer being turned on when the output signal of the second MOS inverter circuit is in a first logic state; and
   a second transfer gate coupled to the input signal, the second transfer gate of the second multiplexer being turned on when the output signal of the second MOS inverter is in a second logic state.

16. A semiconductor memory device, comprising:
   a switching point detection circuit for detecting a switching point variation of a MOS inverter according to a fabrication condition of a MOS transistor, the switching point detection circuit including;
   a reference voltage generation circuit for generating a first reference voltage and a second reference voltage, the first reference voltage being higher than a half power supply voltage, and the second reference voltage being lower than the half power supply voltage;
   a first MOS inverter circuit for receiving the first reference voltage, the first MOS inverter circuit having a switching point at the half power supply voltage; and
   a second MOS inverter circuit for receiving the second reference voltage, the second MOS inverter circuit having a switching point at the half power supply voltage;
   a first multiplexer for selectively outputting a power supply voltage or an input signal according to an output signal of the first MOS inverter circuit;
   a second multiplexer for selectively outputting the power supply voltage or the input signal according to an output signal of the second MOS inverter circuit;
   a third MOS inverter circuit for inverting the input signal;
   a first pull-up circuit for performing a pull-up operation for an output of the third MOS inverter circuit according to an output signal of the first multiplexer; and
   a second pull-up circuit for performing a pull-up operation for the output of the third MOS inverter circuit according to an output signal of the second multiplexer.

17. The semiconductor device as recited in claim 16, further comprising a fourth MOS inverter circuit for inverting an output signal of the third MOS inverter circuit.

18. The semiconductor device as recited in claim 16, wherein the first multiplexer includes:
   a first transfer gate coupled to a power supply voltage, the first transfer gate of the first multiplexer being turned on when an output signal of the first MOS inverter circuit is in a first logic state; and
   a second transfer gate coupled to the input signal, the second transfer gate of the first multiplexer being turned on when the output signal of the first MOS inverter circuit is in a second logic state.

19. The semiconductor device as recited in claim 18, wherein the second multiplexer includes:
   a first transfer gate coupled to the power supply voltage, the first transfer gate of the second multiplexer being turned on when an output signal of the second MOS inverter circuit is in a first logic state; and
   a second transfer gate coupled to the input signal, the second transfer gate of the second multiplexer being turned on when the output signal of the second MOS inverter circuit is in a second logic state.

20. A semiconductor device comprising:
   a buffering circuit for buffering an input signal;
   a switching point detection circuit for detecting a switching point variation of a MOS inverter according to a fabrication condition of a MOS transistor; and
   a delay circuit for delaying the input signal outputted from the buffering circuit under control of the switching point detection circuit,
   wherein the switching point detection circuit includes:
   a reference voltage generation circuit for generating a first reference voltage and a second reference voltage, the second reference voltage being higher than a half power supply voltage and the second reference voltage being lower than the half power supply voltage;
   a first MOS inverter circuit for receiving the first reference voltage; and
   a second MOS inverter circuit for receiving the second reference voltage, wherein each of the first MOS inverter circuit and the second MOS inverter circuit has a switching point at the half power supply voltage.

21. The semiconductor device as recited in claim 20, wherein the delay circuit includes:
   a first delay for delaying the input signal by a first predetermined time;
   a first multiplexer for selectively outputting an output signal of the buffering circuit or an output signal of the first delay according to an output of the first MOS inverter circuit;
   a second delay for delaying an output signal of the first multiplexer by a second predetermined time;
   a third delay for delaying an output signal of the second delay; and
   a second multiplexer for selectively outputting the output signal of the second delay or an output signal of the third delay according to an output signal of the second MOS inverter circuit.

* * * * *

UNITED STATES PATENT AND TRADEMARK OFFICE
CERTIFICATE OF CORRECTION

PATENT NO. : 7,034,598 B2 Page 1 of 1
APPLICATION NO. : 10/335013
DATED : April 25, 2006
INVENTOR(S) : Kwang-Rae Cho It is certified that error appears in the above-identified patent and that said Letters Patent is hereby corrected as shown below:

At Column 10, line 46, "output the" should be -- output, the --.

At Column 10, line 50, "gore" should be -- gate --.

At Column 11, line 37, "transistor," should be -- transistor; --.

At Column 11, line 44, "and first" should be -- and the first --.

At Column 13, line 36, "including;" should be -- including: --.

Signed and Sealed this

Sixth Day of February, 2007

JON W. DUDAS
*Director of the United States Patent and Trademark Office*